US011538700B2

(12) United States Patent
Ayabe (10) Patent No.: US 11,538,700 B2
(45) Date of Patent: Dec. 27, 2022

(54) SUBSTRATE PROCESSING APPARATUS AND SUBSTRATE PROCESSING METHOD

(71) Applicant: Tokyo Electron Limited, Tokyo (JP)

(72) Inventor: Go Ayabe, Koshi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 151 days.

(21) Appl. No.: 16/878,040

(22) Filed: May 19, 2020

(65) Prior Publication Data

US 2020/0373179 A1 Nov. 26, 2020

(30) Foreign Application Priority Data

May 21, 2019 (JP) .............................. JP2019-095493

(51) Int. Cl.
*H01L 21/677* (2006.01)
*H01L 21/67* (2006.01)
*H01L 21/687* (2006.01)
*B08B 3/08* (2006.01)
*B65G 47/90* (2006.01)

(52) U.S. Cl.
CPC .......... *H01L 21/67265* (2013.01); *B08B 3/08* (2013.01); *B65G 47/90* (2013.01); *H01L 21/67051* (2013.01); *H01L 21/67772* (2013.01); *H01L 21/67778* (2013.01); *H01L 21/68764* (2013.01)

(58) Field of Classification Search
CPC ............................................... H01L 21/67778
See application file for complete search history.

(56) References Cited

U.S. PATENT DOCUMENTS

| 5,239,182 | A | * | 8/1993 | Tateyama | .......... | H01L 21/67265 |
| | | | | | | 250/559.37 |
| 5,466,945 | A | * | 11/1995 | Brickell | ............ | H01L 21/67265 |
| | | | | | | 250/559.12 |
| 7,751,922 | B2 | * | 7/2010 | Hirano | .............. | H01L 21/67265 |
| | | | | | | 700/112 |
| 9,184,080 | B2 | * | 11/2015 | Yoshida | ............ | H01L 21/67781 |
| 9,373,531 | B2 | * | 6/2016 | Murata | ............. | H01L 21/67265 |
| 10,094,951 | B2 | * | 10/2018 | Togashi | ................... | G01V 8/20 |
| 2008/0193274 | A1 | * | 8/2008 | Hirano | .................... | C23C 16/52 |
| | | | | | | 414/804 |

(Continued)

FOREIGN PATENT DOCUMENTS

JP 11-145244 A 5/1999

*Primary Examiner* — Gerald McClain
(74) *Attorney, Agent, or Firm* — Nath, Goldberg & Meyer; Jerald L. Meyer; Tanya E. Harkins (57) ABSTRACT

There is provided a substrate processing apparatus, including: a mounting part on which a carrier having a plurality of slots capable of accommodating a plurality of substrates is mounted; a transfer part configured to load and unload the substrates to and from the plurality of slots based on a reference accommodation position set in the mounting part; a detection part configured to detect a position of each of the plurality of substrates accommodated in the plurality of slots; and a correction part configured to correct the reference accommodation position based on port accumulation information in which detection results obtained by the detection part from a plurality of carriers which has been mounted on the mounting part in the past are accumulated.

7 Claims, 8 Drawing Sheets

(56) References Cited

U.S. PATENT DOCUMENTS

| | | | |
|---|---|---|---|
| 2012/0290124 A1* | 11/2012 | Kimura | H01L 21/67265 |
| | | | 700/218 |
| 2013/0238113 A1* | 9/2013 | Kawasaki | H01L 21/677 |
| | | | 700/121 |
| 2014/0178162 A1* | 6/2014 | Morikawa | H01L 21/67772 |
| | | | 414/416.08 |
| 2015/0300960 A1* | 10/2015 | Morikawa | G01N 21/88 |
| | | | 356/240.1 |
| 2016/0091306 A1* | 3/2016 | Hashimoto | B25J 11/0095 |
| | | | 414/222.02 |
| 2017/0301540 A1* | 10/2017 | Hashimoto | H01L 21/67386 |

* cited by examiner

| Load port | Reference accommodation position |
|---|---|
| P1 | X1 |
| P2 | X2 |
| P3 | X3 |
| P4 | X4 |

SUBSTRATE PROCESSING APPARATUS AND SUBSTRATE PROCESSING METHOD

CROSS-REFERENCE TO RELATED APPLICATION

This application is based upon and claims the benefit of priority from Japanese Patent Application No. 2019-095493, filed on May 21, 2019, the entire contents of which are incorporated herein by reference.

TECHNICAL FIELD

The present disclosure relates to a substrate processing apparatus and a substrate processing method.

BACKGROUND

As a substrate processing apparatus for processing a substrate such as a semiconductor wafer or a glass substrate, there is known a substrate processing apparatus that sequentially takes out substrates from a cassette containing a plurality of substrates, transfers the substrates to a processing part and performs processing of each of the substrates in the processing part.

In this type of substrate processing apparatus, a mapping process for detecting a substrate storage state such as the presence or absence of the substrates in the cassette and a storage position is performed before taking out the substrates from the cassette.

PRIOR ART DOCUMENTS

Patent Documents

Patent Document 1: Japanese Laid-Open Patent Publication No. H11-145244

SUMMARY

According to one embodiment of the present disclosure, there is provided a substrate processing apparatus, including: a mounting part on which a carrier having a plurality of slots capable of accommodating a plurality of substrates is mounted; a transfer part configured to load and unload the substrates to and from the plurality of slots based on a reference accommodation position set in the mounting part; a detection part configured to detect a position of each of the plurality of substrates accommodated in the plurality of slots; and a correction part configured to correct the reference accommodation position based on port accumulation information in which detection results obtained by the detection part from a plurality of carriers which has been mounted on the mounting part in the past are accumulated.

BRIEF DESCRIPTION OF DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

DETAILED DESCRIPTION

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

Hereinafter, aspects (hereinafter referred to as "embodiments") of a substrate processing apparatus and a substrate processing method according to the present disclosure will be described in detail with reference to the drawings. The embodiments are not limited to the substrate processing apparatus and the substrate processing method according to the present disclosure. In addition, the respective embodiments may be appropriately combined within a range that does not make processing contents contradictory. In the following embodiments, the same parts are denoted by like reference numerals, and the redundant description thereof will be omitted.

In each of the drawings referred to below, for the sake of easy understanding, there are defined an X-axis direction, a Y-axis direction and a Z-axis direction that are orthogonal to each other, and there may be shown an orthogonal coordinate system in which the Z-axis positive direction is a vertically upward direction. In addition, the rotation direction about the vertical axis as a rotation center may be referred to as a θ direction.

Figure 1:
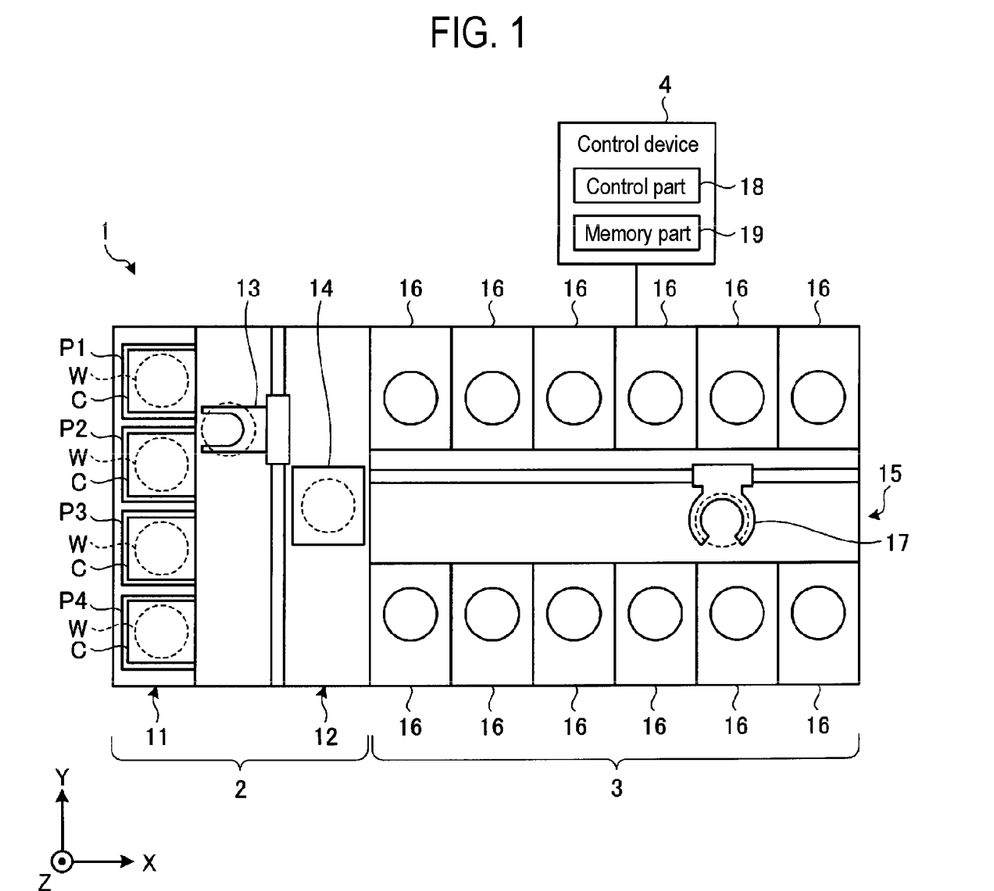
FIG. 1 is a view illustrating a configuration of a substrate processing system according to an embodiment.

FIG. 1 is a view illustrating a configuration of a substrate processing system according to an embodiment. As shown in FIG. 1, the substrate processing system 1 includes a loading/unloading station 2 and a processing station 3. The loading/unloading station 2 and the processing station 3 are installed adjacent to each other.

The loading/unloading station 2 includes a carrier mounting table 11 and a transfer part 12. A plurality of carriers C that horizontally accommodate a plurality of substrates, for example, semiconductor wafers (hereinafter referred to as wafers W) in the present embodiment, is mounted on the carrier mounting table 11.

A plurality of load ports P1 to P4 is arranged on the carrier mounting table 11 so as to be adjacent to the transfer part 12, and one carrier C is mounted on each of the plurality of load ports P1 to P4. A plurality of (for example, three) pins (not shown) is installed on the upper surface of each of the load ports P1 to P4, and the carrier C is mounted on the plurality of pins.

The transfer part 12 is installed adjacent to the carrier mounting table 11 and includes a substrate transfer device 13 and a delivery part 14 installed therein. The substrate transfer device 13 includes a wafer holding mechanism that holds a wafer W. Furthermore, the substrate transfer device 13 may move in a horizontal direction and a vertical direction and may rotate about a vertical axis. The substrate transfer device 13 transfers the wafer W between the carrier C and the delivery part 14 using the wafer holding mechanism.

The processing station 3 is installed adjacent to the transfer part 12. The processing station 3 includes a transfer part 15 and a plurality of processing units 16. The processing units 16 are installed side by side on both sides of the transfer part 15.

The transport part 15 includes a substrate transport device 17 installed therein. The substrate transfer device 17 includes a wafer holding mechanism that holds the wafer W. Furthermore, the substrate transfer device 17 may move in the horizontal direction and the vertical direction and may rotate about the vertical axis. The substrate transport device 17 transfers the wafer W between the delivery part 14 and the processing units 16 using the wafer holding mechanism.

The processing unit 16 performs a predetermined substrate processing process on the wafer W transferred by the substrate transfer device 17.

Furthermore, the substrate processing system 1 includes a control device 4. The control device 4 is, for example, a computer, and includes a control part 18 and a memory part 19. The memory part 19 stores a program for controlling various processes executed in the substrate processing system 1. The control part 18 controls the operation of the substrate processing system 1 by reading and executing the program stored in the memory part 19.

Such a program may be recorded on a computer-readable storage medium and may be installed in the memory part 19 of the control device 4 from the storage medium. Examples of the computer-readable storage medium include a hard disk (HD), a flexible disk (FD), a compact disk (CD), a magneto-optical disk (MO) and a memory card.

In the substrate processing system 1 configured as described above, first, the substrate transfer device 13 of the loading/unloading station 2 takes out the wafer W from the carrier C mounted on the carrier mounting table 11 and mounts the taken-out wafer W on the delivery part 14. The wafer W mounted on the delivery part 14 is taken out from the delivery part 14 by the substrate transfer device 17 of the processing station 3 and is loaded into the processing unit 16.

The wafer W loaded into the processing unit 16 is processed by the processing unit 16. Thereafter, the wafer W is unloaded from the processing unit 16 by the substrate transfer device 17 and is mounted on the delivery part 14. Then, the processed wafer W mounted on the delivery part 14 is returned to the carrier C of the carrier mounting table 11 by the substrate transfer device 13.

Figure 2:
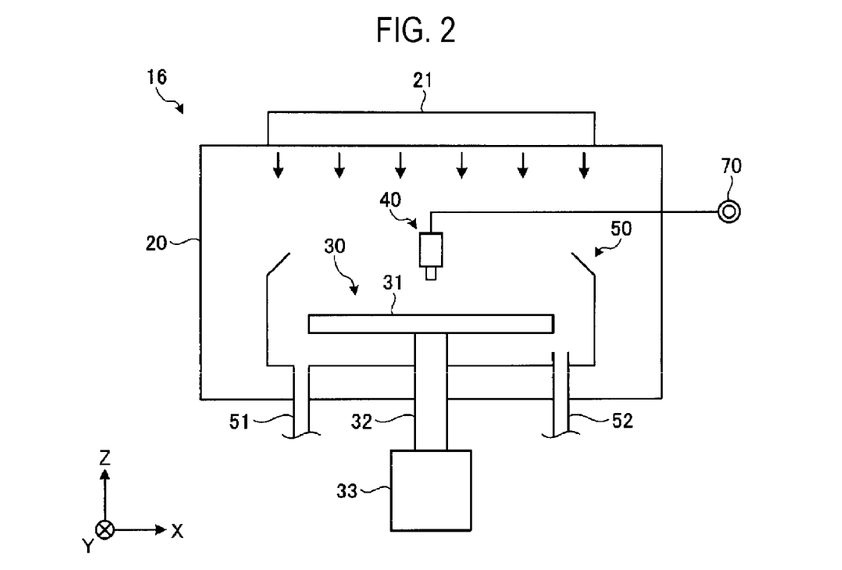
FIG. 2 is a view illustrating a configuration of a processing unit according to an embodiment.

Next, the processing unit 16 will be described with reference to FIG. 2. FIG. 2 is a view showing the configuration of the processing unit 16 according to an embodiment.

As shown in FIG. 2, the processing unit 16 includes a chamber 20, a substrate holding mechanism 30, a processing fluid supply part 40 and a collection cup 50.

The chamber 20 accommodates the substrate holding mechanism 30, the processing fluid supply part 40 and the collection cup 50. A Fan Filter Unit (FFU) 21 is installed on the ceiling of the chamber 20. The FFU 21 forms a down flow in the chamber 20.

The substrate holding mechanism 30 includes a holding part 31, a support post part 32 and a driving part 33. The holding part 31 holds the wafer W horizontally. The support post part 32 is a member extending in the vertical direction. The base end portion of the support post part 32 is rotatably supported by the driving part 33. The distal end portion of the support post part 32 supports the holding part 31 horizontally. The driving part 33 rotates the support post part 32 about the vertical axis. The substrate holding mechanism 30 rotates the holding part 31 supported on the support post part 32 by rotating the support post part 32 using the driving part 33, thereby rotating the wafer W held by the holding part 31.

The processing fluid supply part 40 supplies a processing fluid to the wafer W. The processing fluid supply part 40 is connected to a processing fluid supply source 70.

The collection cup 50 is disposed so as to surround the holding part 31 and is configured to collect the processing liquid scattered from the wafer W due to the rotation of the holding part 31. A drain port 51 is formed at the bottom of the collection cup 50. The processing fluid collected by the collection cup 50 is discharged from the drain port 51 to the outside of the processing unit 16. Furthermore, an exhaust port 52 for discharging the gas supplied from the FFU 21 to the outside of the processing unit 16 is formed at the bottom of the collection cup 50.

Figure 3:
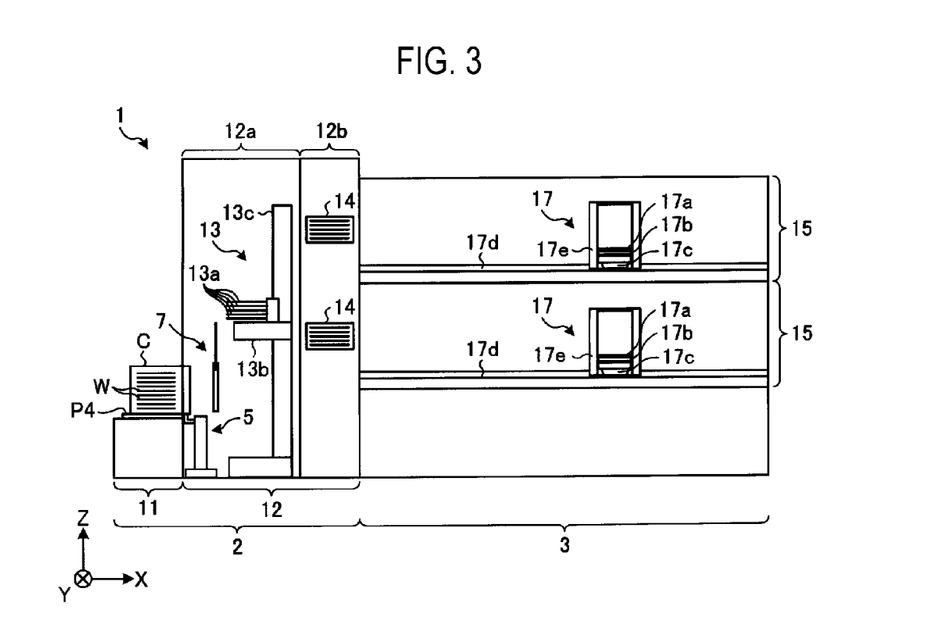
FIG. 3 is a view illustrating an example of an internal configuration of the substrate processing system.
Figure 4:
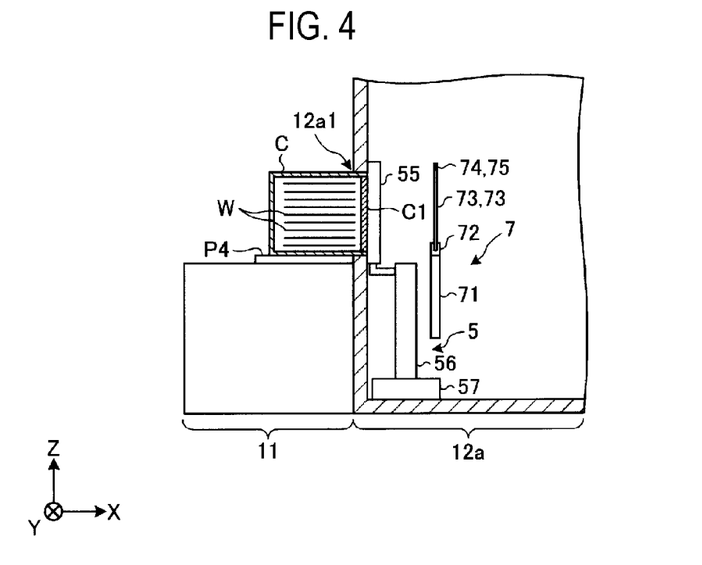
FIG. 4 is a view illustrating an example of a configuration of a lid opening/closing mechanism and a substrate detection part.
Figure 5:
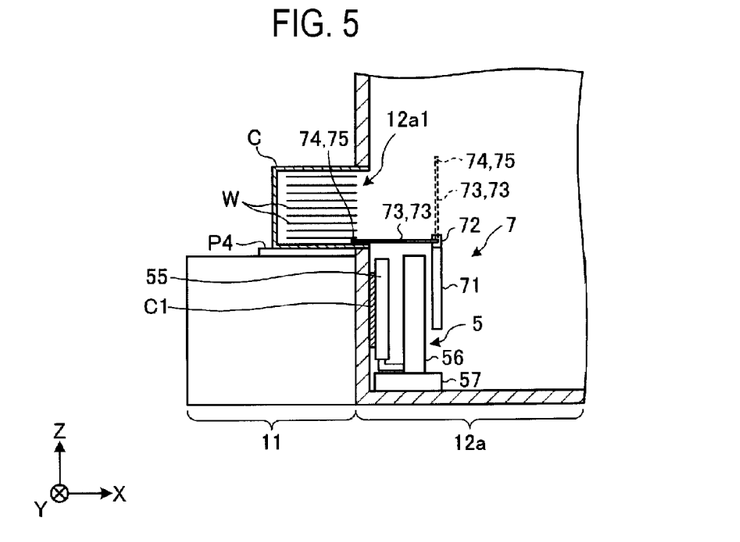
FIG. 5 is a view illustrating the example of the configuration of the lid opening/closing mechanism and the substrate detection part.
Figure 6:
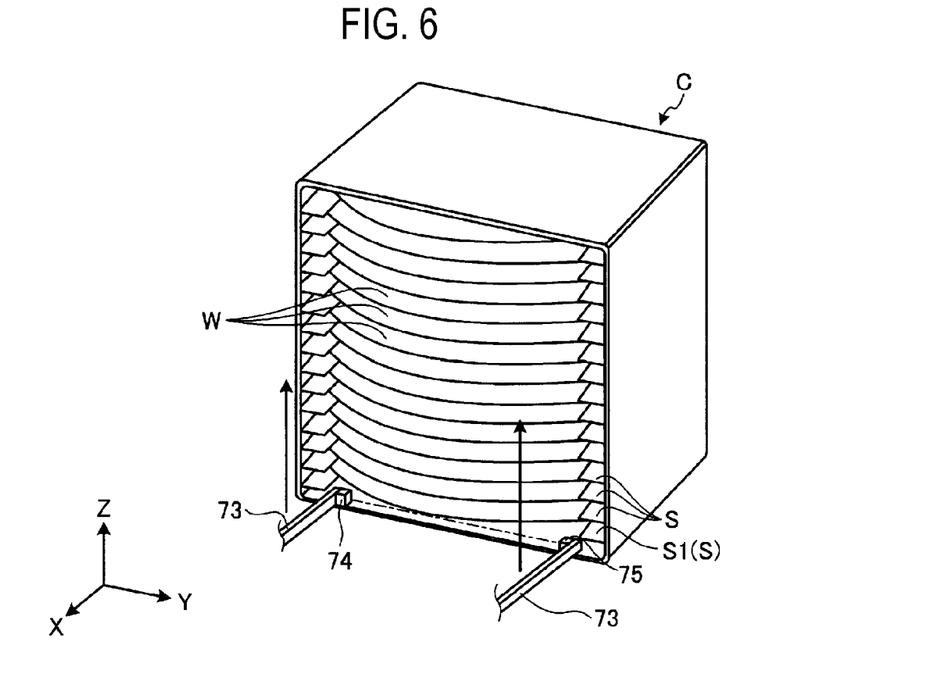
FIG. 6 is a view illustrating an example of the configuration of the substrate detection part.

Next, the internal configuration of the substrate processing system 1 will be described with reference to FIGS. 3 to 6. FIG. 3 is a view illustrating an example of the internal configuration of the substrate processing system 1. FIGS. 4 and 5 are views illustrating an example of the configuration of a lid opening/closing mechanism and a substrate detection part. FIG. 6 is a view illustrating an example of the configuration of the substrate detection part.

In FIGS. 3 and 4, there is shown a simplified schematic side view in which the substrate processing system 1 is perspectively viewed from the negative direction of the Y axis. Hereinafter, the substrate transfer device 13 will be described as "first transfer device 13", and the substrate transfer device 17 will be described as "second transfer device 17".

First, the configuration of the loading/unloading station 2 will be described. As shown in FIG. 3, the transfer part 12 of the loading/unloading station 2 includes a loading/unloading chamber 12a and a delivery chamber 12b.

The loading/unloading chamber 12a is installed adjacent to the carrier mounting table 11. A first transfer device 13, a plurality of lid opening/closing mechanisms 5 and a plurality of substrate detection parts 7 are arranged in the loading/unloading chamber 12a. The plurality of lid opening/closing mechanisms 5 and the plurality of substrate detection parts 7 are installed so as to correspond to the plurality of load ports P1 to P4.

The first transfer device 13 includes a plurality of wafer holding parts 13a and a moving mechanism 13b. The plurality of wafer holding parts 13a may hold a plurality of (here, five) wafers W in multiple stages at intervals. The moving mechanism 13b raises and lowers the plurality of wafer holding parts 13a along a vertical guide 13c extending in the vertical direction. The moving mechanism 13b moves the plurality of wafer holding parts 13a in the horizontal direction and rotates them around the vertical axis.

Next, the configuration of the lid opening/closing mechanism 5 will be described with reference to FIGS. 4 and 5. As shown in FIG. 4, a transfer port 12a1 for the wafer W is formed on the wall surface of the loading/unloading chamber 12a on which the carrier mounting table 11 is installed. The lid opening/closing mechanism 5 includes a door part 55 for closing the transfer port 12a1 from the side of the loading/unloading chamber 12a, an elevating part 56 for raising and lowering the door part 55, and a horizontal moving part 57 for moving the door part 55 and the elevating part 56 along the horizontal direction (here, the X-axis direction).

The door part 55 includes, for example, a latch key (not shown) that rotates around a horizontal axis. The latch key is inserted into a keyhole (not shown) formed in the lid C1 of the carrier C and is rotated to engage with the lid C1. After bringing the lid C1 into engagement with the door part 55, the lid opening/closing mechanism 5 retreats the door part 55 by the horizontal moving part 57, and then lowers the door part 55 by the elevating part 56. As a result, the lid C1 is removed from the carrier C so that the loading/unloading chamber 12a and the carrier C communicate with each other.

Next, the configuration of the substrate detection part 7 will be described with reference to FIGS. 4 to 6. The substrate detection part 7 is used for a mapping process for detecting a substrate storage state such as the presence or absence of wafers W in the carrier C and substrate storage positions before taking out the wafers W from the carrier C.

As shown in FIGS. 4 and 5, the substrate detection part 7 includes an elevating mechanism 71, a rotating mechanism 72, two support arms 73, a light emitting part 74 and a light receiving part 75.

The elevating mechanism 71 raises and lowers the rotating mechanism 72. The rotating mechanism 72 rotates the two support arms 73 around a horizontal axis along the Y-axis direction. The light emitting part 74 is installed at the tip end of one of the two support arms 73, and the light receiving part 75 is installed at the tip end of the other of the two support arms 73.

As shown in FIG. 4, before the start of the mapping process, the two support arms 73 take an upwardly-extending posture. On the other hand, when the mapping process is started, the rotating mechanism 72 rotates the two support arms 73 so that as shown in FIG. 5, the two support arms 73 take a posture extending in the horizontal direction. As a result, the light emitting part 74 and the light receiving part 75 installed at the tip ends of the two support arms 73 are arranged in the carrier C.

As shown in FIG. 6, the carrier C has a plurality of slots S capable of accommodating a plurality of wafers W therein. The plurality of slots S are arranged in multiple stages at intervals along the height direction (vertical direction).

The light emitting part 74 and the light receiving part 75 are horizontally arranged on the left and right sides of the opening of the carrier C so as to face each other. The substrate detection part 7 moves the light emitting part 74 and the light receiving part 75 along the vertical direction by using the elevating mechanism 71 in a state in which the light is irradiated from the light emitting part 74. More specifically, the substrate detection part 7 moves the light emitting part 74 and the light receiving part 75 upward from a position below the lowermost slot S (hereinafter referred to as "first slot S1") among the plurality of slots S to a position above the uppermost slot S.

When there is no wafer W between the light emitting part 74 and the light receiving part 75, the light emitted from the light emitting part 74 is received by the light receiving part 75. On the other hand, when the wafer W exists between the light emitting part 74 and the light receiving part 75, the light emitted from the light emitting part 74 is blocked by the wafer W and does not reach the light receiving part 75. Thus, the substrate detection part 7 may detect the wafer W accommodated in the carrier C.

Returning to FIG. 3, the configuration of the delivery chamber 12b will be described. As shown in FIG. 3, the delivery chamber 12b is installed between the loading/unloading chamber 12a and the processing station 3. A plurality of (two, in this case) delivery parts 14 is arranged inside the delivery chamber 12b. The two delivery parts 14 are arranged in parallel in the height direction (Z-axis direction). Each delivery part 14 has a plurality of slots in which a plurality of wafers W can be placed in multiple stages.

The processing station 3 includes a plurality of (here, two) transfer parts 15. The transfer parts 15 are arranged in parallel in the height direction (Z-axis direction).

A second transfer device 17 is disposed in each transfer part 15. The second transfer device 17 includes a first wafer holding part 17a, a second wafer holding part 17b and a moving mechanism 17c.

Each of the first wafer holding part 17a and the second wafer holding part 17b may hold one wafer W. For example, the first wafer holding part 17a holds the wafer W before being processed by the processing unit 16, and the second wafer holding part 17b holds the wafer W after being processed by the processing unit 16.

The moving mechanism 17c moves the first wafer holding part 17a and the second wafer holding part 17b along a horizontal guide 17d extending in the horizontal direction (X-axis direction). The moving mechanism 17c raises and lowers the first wafer holding part 17a and the second wafer holding part 17b along a vertical guide 17e extending in the vertical direction. The moving mechanism 17c moves the first wafer holding unit 17a and the second wafer holding unit 17b along the horizontal direction (Y-axis direction) orthogonal to the extension direction of the horizontal guide 17d, and rotates them about the vertical axis.

In the substrate processing system 1, first, the lid C1 of the carrier C is opened using the lid opening/closing mechanism 5, and then the mapping processing is performed using the substrate detection part 7.

By performing the mapping process, information such as, the execution date and time, the execution timing, the identification information of the load ports P1 to P4 (hereinafter described as "port ID") and the identification information of the carrier C (hereinafter described as "carrier ID") is obtained. The execution date and time are, for example, the date and time when the mapping process was executed. The execution timing is an execution timing of the mapping process in a series of substrate processes, and includes, for example, a timing before processing (performed by the processing unit 16), a timing of retry before processing, a timing after processing, a timing of retry after processing, and the like. The term "retry" refers to, for example, an operation of once closing the lid C1 of the carrier C using the lid opening/closing mechanism 5 and then opening the lid C1 again when an abnormality is detected by the mapping process. By closing the lid C1 of the carrier C once, the wafer W may be pressed against the lid C1 to return the position and posture of the wafer W to a normal state. Thereafter, when the mapping process is performed again, it is possible to eliminate the abnormality detected at the beginning.

In the mapping process, for example, information such as the number of slots, the presence or absence of the wafer W, the position of the wafer W, the thickness of the wafer W, and an abnormal code is acquired. The abnormal code is, for example, information indicating the type of an abnormality detected by the mapping process, such as a position shift of the wafer W and an abnormal thickness of the wafer W. The presence/absence of the wafer W, the position of the wafer W and the thickness of the wafer W are acquired for each slot S.

If no abnormality is detected in the mapping process, the first transfer device 13 collectively takes out five wafers W from the carrier C and mounts them on the delivery part 14. At this time, the first transfer device 13 unloads the wafers W based on the "reference accommodation position" set for each of the load ports P1 to P4.

The term "reference accommodation position" refers to a position recognized as a height position of the first slot based on the upper surface of each of the load ports P1 to P4 when the carrier having slots whose height positions and the like conform to a specific standard is mounted on each of the load ports P1 to P4. The reference accommodation position is defined by the driving positions of the light emitting part 74 and the light receiving part 75. The term "driving positions" refer to distances from the origin positions of the light emitting part 74 and the light receiving part 75 in the elevating mechanism 71. The setting of the reference accommodation position is manually performed for each of the load ports P1 to P4 using a carrier or a jig that conforms to the aforementioned standard, and is stored in the memory part 19.

Thereafter, the second transfer device 17 takes out one wafer W from the delivery part 14 and loads it into one of the processing units 16.

Subsequently, the processing unit 16 performs a predetermined process on the loaded wafer W. For example, the processing unit 16 performs a chemical liquid process for supplying a chemical liquid to the wafer W, a rinsing process for supplying a rinsing liquid to the wafer W, and a drying process for drying the wafer W. In the present embodiment, it is assumed that the processing contents and the processing time in the respective processing units 16 are the same. When the processes performed by the processing unit 16 are completed, the second transfer device 17 takes out the wafer W from the processing unit 16 and mounts it on the delivery part 14. Thereafter, the first transfer device 13 collectively takes out five wafers W from the delivery part 14 and accommodates them in the carrier C. Even at this time, the first transfer device 13 loads the plurality of wafers W into the carrier C based on the reference accommodation position.

On the other hand, when an abnormality is detected in the mapping process, the process for the plurality of wafers W accommodated in the carrier C in which the abnormality is detected is stopped, and an alarm including information such as an error code is outputted to a higher-level device or the like.

Figure 7:
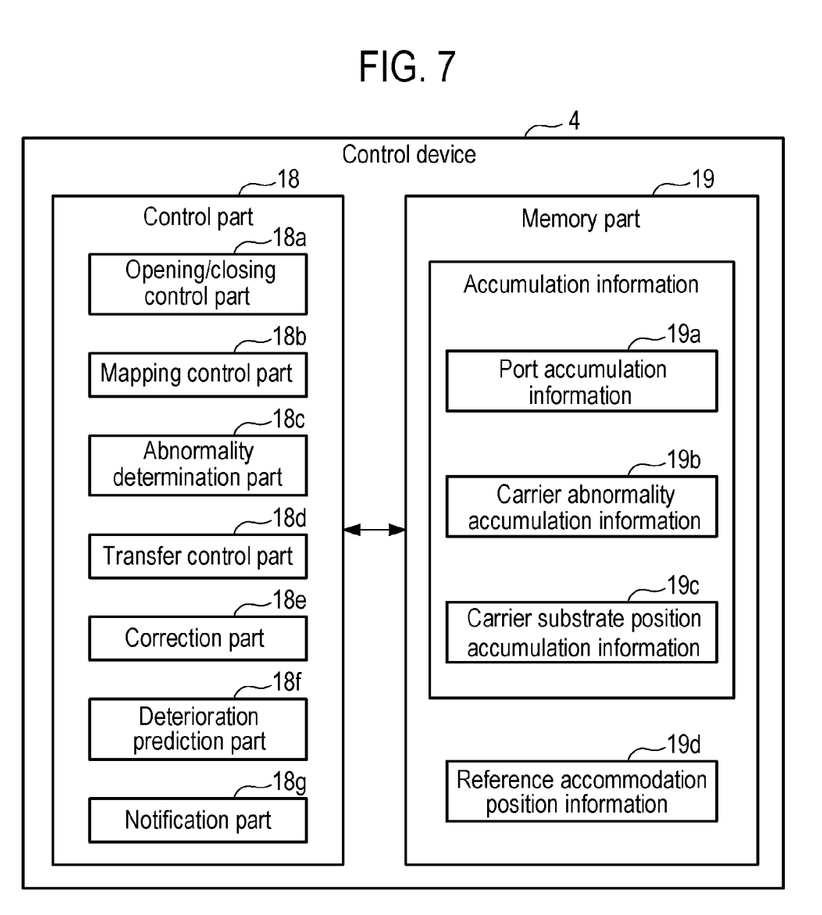
FIG. 7 is a block diagram illustrating an example of a configuration of a control device.

FIG. 7 is a block diagram illustrating an example of the configuration of the control device 4. FIG. 7 shows only some of the plurality of components included in the control device 4.

As shown in FIG. 7, the control device 4 includes a control part 18 and a memory part 19. The control part 18 includes, for example, a microcomputer having a CPU (Central Processing Unit), a ROM (Read Only Memory), a RAM (Random Access Memory), an input/output port and the like, and various circuits. The control part 18 includes a plurality of processing parts that function when the CPU executes a program stored in the ROM using the RAM as a work area. For example, the control part 18 includes an opening/closing control part 18a, a mapping control part 18b, an abnormality determination part 18c, a transfer control part 18d, a correction part 18e, a deterioration prediction part 18f, and a notification part 18g. These processing parts may be partially or entirely configured by hardware such as an ASIC (Application Specific Integrated Circuit) or an FPGA (Field Programmable Gate Array).

The memory part 19 is realized by, for example, a semiconductor memory device such as a RAM and a flash memory, or a storage device such as a hard disk and an optical disk. The memory part 19 stores port accumulation information 19a, carrier abnormality accumulation information 19b, carrier substrate position accumulation information 19c, reference accommodation position information 19d, and the like. These pieces of information may be stored in an external memory device.

The opening/closing control part 18a opens and closes the lid C1 of the carrier C by controlling the lid opening/closing mechanism 5. Specifically, when taking out an unprocessed wafer W from the carrier C, the opening/closing control part 18a controls the lid opening/closing mechanism 5 to execute a lid opening process for opening the lid C1 of the carrier C. When accommodating a processed wafer W in the carrier C, the opening/closing control part 18a controls the lid opening/closing mechanism 5 to execute a lid closing process for closing the lid C1 of the carrier C after the processed wafer W is accommodated in the carrier C.

In the lid opening process, the opening/closing control part 18a controls the horizontal moving part 57 to retreat the door part 55, and then controls the elevating part 56 to lower the door part 55. In the lid closing process, the opening/closing control part 18a controls the elevating part 56 to raise the door part 55, and then controls the horizontal moving part 57 to move the door part 55 forward.

Further, by controlling the lid opening/closing mechanism 5, the opening/closing control part 18a performs a retry process of first closing the lid C1 of the carrier C and then opening the lid C1 again. Specifically, the opening/closing control part 18a performs the same process as the above-described lid closing process to close the lid C1, and then performs the same process as the above-described lid opening process to open the lid C1 again.

Furthermore, when taking out the wafer W from the carrier C that has been determined to be abnormal with a high probability in the mapping process performed in the past, the opening/closing control part 18a performs a pre-retry process of opening and closing the lid C1 before performing the above-described lid opening process.

In the pre-retry process, the opening/closing control part 18a controls the horizontal moving part 57 to retreat the door part 55, and then controls the horizontal moving part 57 to move the door part 55 forward. As described above, in the pre-retry process, the lid C1 is opened and closed without raising or lowering the door part 55 by the elevating part 56. Therefore, it is possible to shorten the process time as compared with an ordinary retry process. The conditions of the carrier C to be subjected to the pre-retry process will be described later.

The mapping control part 18b controls the substrate detection part 7 to perform a mapping process. Furthermore, the mapping control part 18b generates various types of accumulation information by accumulating, in the memory part 19, various types of information obtained by the mapping process. For example, the mapping control part 18b generates the port accumulation information 19a, the carrier abnormality accumulation information 19b and the carrier substrate position accumulation information 19c as the accumulation information.

The port accumulation information 19a is information in which the detection results obtained by the substrate detection part 7 from the plurality of carriers C mounted on the load ports P1 to P4 in the past are accumulated in a chronological order. The mapping control part 18b generates the port accumulation information 19a by accumulating the information on the height position of the first slot Si (the position of the wafer W mounted on the first slot S1) among the various types of information obtained by the mapping process. The port accumulation information 19a is generated for each of the load ports P1 to P4.

The carrier abnormality accumulation information 19b is information in which the determination results obtained by the abnormality determination part 18c are accumulated for each carrier C (for each carrier ID). For example, the carrier abnormality accumulation information 19b includes a probability (hereinafter referred to as "initial abnormality rate") at which an abnormality is determined by the abnormality determination part 18c in an initial mapping process. Further, the carrier abnormality accumulation information 19b includes a probability (hereinafter referred to as "post-retry abnormality rate") at which an abnormality is determined by the abnormality determination part 18c in the mapping process after the retry process.

The above-described pre-retry process is executed based on the carrier abnormality accumulation information 19b. That is, the opening/closing control part 18a acquires the carrier substrate position accumulation information 19c associated with the carrier ID of the corresponding carrier C from the memory part 19. Then, when the initial abnormality rate included in the acquired carrier substrate position accumulation information 19c exceeds a threshold value, the opening/closing control part 18a executes the pre-retry process.

The opening/closing control part 18a may perform the pre-retry process when the initial abnormality rate included in the acquired carrier substrate position accumulation information 19c exceeds a first threshold value and the post-retry abnormality rate included in the acquired carrier substrate position accumulation information 19c is less than a second threshold value.

As described above, for each carrier C, based on the carrier abnormality accumulation information 19b, the opening/closing control part 18a controls the lid opening/closing mechanism 5 to perform an operation of opening and closing the lid C1 after the carrier C is mounted on each of the load ports P1 to P4 and before the detection process is performed by the substrate detection part 7. Since the pre-retry process can be completed in a shorter time than the retry process, the throughput can be enhanced by performing the pre-retry process on the carrier C having a high probability of being determined to be abnormal or the carrier C having a high probability that the abnormality is eliminated by the retry process.

The carrier substrate position accumulation information 19c is information in which the height position of the first slot 51 (hereinafter referred to as "first slot position") detected by the substrate detection part 7 for each carrier C (for each carrier ID) is accumulated in a chronological order.

Figure 8:
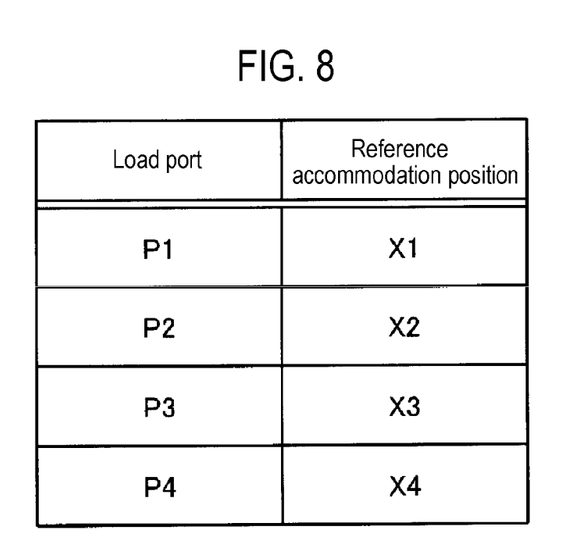
FIG. 8 is a view illustrating an example of reference accommodation position information.

The abnormality determination part 18c determines the abnormality of the carrier C based on the result of the mapping process and the reference accommodation position information 19d. FIG. 8 is a view illustrating an example of the reference accommodation position information 19d.

As shown in FIG. 8, the reference accommodation position information 19d is information in which the port IDs of the load ports P1 to P4 (here, "P1" to "P4") are associated with the reference accommodation positions. For example, the port ID "P1" is associated with the reference accommodation position "X1", and the port ID "P2" is associated with the reference accommodation position "X2". Thus, the reference accommodation position differs for each of the load ports P1 to P4.

The abnormality determination part 18c acquires the reference accommodation positions of the corresponding load ports P1 to P4 from the reference accommodation position information 19d, and calculates the standard height position of each slot S based on the acquired reference accommodation positions. In addition, the abnormality determination part 18c calculates the difference between the calculated standard height position of each slot S and the position of each wafer W detected by the substrate detection part 7 as a shift amount of the wafer W in each slot S. Then, the abnormality determination part 18c determines whether the calculated shift amount falls within a threshold value range centered on the reference accommodation position. When the calculated shift amount exceeds the threshold value range, the abnormality determination part 18c determines the carrier C to be abnormal.

Thus, the abnormality determination part 18c determines the abnormality of the carrier C based on the comparison of the position of the wafer W detected by the substrate detection part 7 with the reference accommodation position.

The transfer control part 18d controls the transfer of the wafer W by the first transfer device 13 and the second transfer device 17. Specifically, the transfer control part 18d acquires the reference accommodation position corresponding to each of the load ports P1 to P4 mounted with the carrier C from the reference accommodation position information 19d stored in the memory part 19. Then, the transfer control part 18d is controlled based on the acquired reference accommodation position, whereby the transfer control part 18d is caused to perform an unloading operation of unloading the wafer W from the carrier C or a loading operation of loading the wafer W into the carrier C.

The correction part 18e corrects the reference accommodation position stored in the memory part 19 based on the port accumulation information 19a accumulated for each of the load ports P1 to P4.

Figure 9:
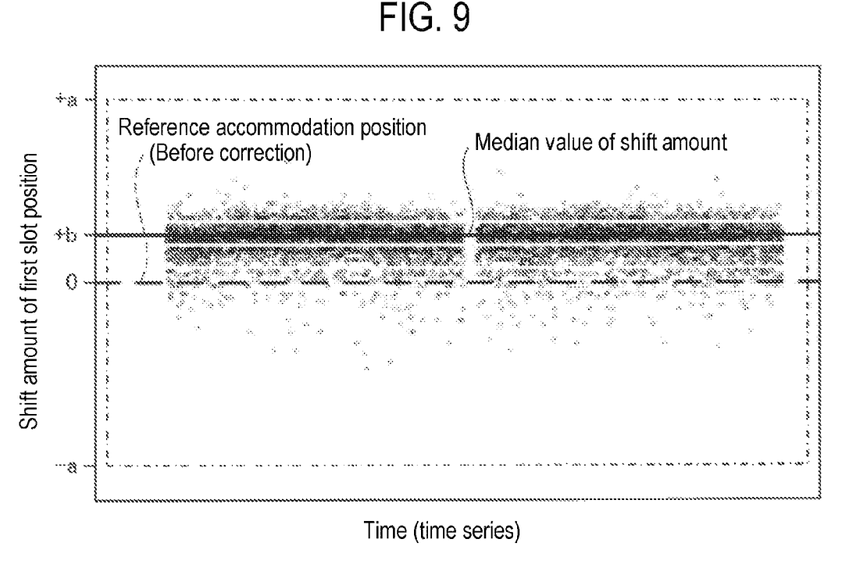
FIG. 9 is an example of a graph in which first slot positions detected from a plurality of carriers mounted on a certain load port in the past are plotted in time series.
Figure 10:
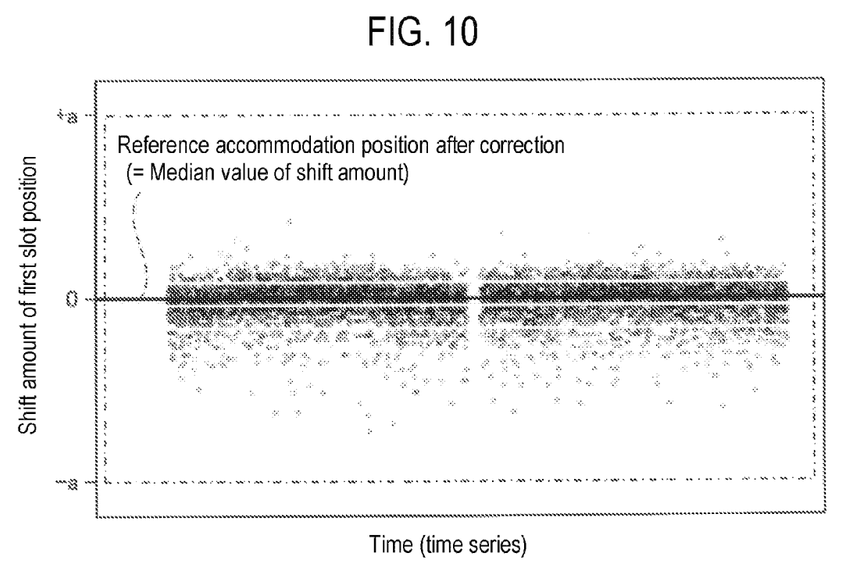
FIG. 10 is a view illustrating an example of a correction process performed by a correction part.

FIG. 9 is an example of a graph in which the first slot positions detected from the plurality of carriers C mounted on the load ports P1 to P4 in the past are plotted in time series. FIG. 10 is a view illustrating an example of a correction process performed by the correction part 18e.

As described above, the reference accommodation position is the height position of the first slot S1 when the carrier whose height position or the like conforms to the standard is mounted on each of the load ports P1 to P4. However, the carrier C actually used does not always conform to the standard. For this reason, as shown in FIG. 9, even if adjustment is made using a jig or the like that can adjust the first slot position on the standard, a shift may occur in the actual first slot position obtained by the mapping process.

The graph shown in FIG. 9 indicates that the first slot position is detected at a higher position as a whole. As described above, the abnormality determination part 18c determines the carrier C to be abnormal when the shift amount of the first slot position exceeds a threshold value range (the range of ± a in FIG. 9) centered on the reference accommodation position. Therefore, when the position of the first slot is shifted to a higher position as a whole, for example, when the wafer W accommodated in the first slot Si is inclined upward, it is likely that the carrier C is determined to be abnormal.

Therefore, the correction part 18e calculates, for example, a median value of the shift amount of the first slot position from the port accumulation information 19a, and corrects the reference accommodation position just as much as the calculated median value. For example, it is assumed that the calculated median value is "+b". In this case, the correction part 18e obtains "X1 +b" by adding "b" to the reference accommodation position (e.g., "X1") of the corresponding load ports P1 to P4 among the port accumulation information 19a stored in the memory part 19, and stores "X1 +b" in the memory part 19 as a new reference accommodation position.

By correcting the reference accommodation position in this manner, the threshold value range centered on the reference accommodation position is appropriately set as shown in FIG. 10. This makes it possible to reduce the frequency at which an abnormality is determined by the abnormality determination part 18c. Therefore, it is possible to enhance the throughput.

Although there has been described the example where the correction part 18e calculates the median value of the shift amount from the port accumulation information 19a, the correction part 18e may calculate an average value of the shift amount. In addition, the correction part 18e may use a regression analysis technique to calculate, for example, a value of y when a regression line where a difference between two variables x and y is minimum is infinitely parallel to the x-axis.

As described above, based on the port accumulation information 19a, the correction part 18e may calculate a predicted value of the first slot position predicted to be detected by the substrate detection part 7 when the carrier C is mounted on each of the load ports P1 to P4.

The inventor of the present application has found that the wafer W accommodated in the carrier C is easily inclined downward. By making use of this characteristic, the correction part 18e may correct the reference accommodation position with a value obtained by adding a predetermined correction value to the calculated predicted value. This makes it possible to more appropriately correct the reference accommodation position.

The deterioration prediction part 18f predicts the deterioration of the carrier C based on the carrier substrate position accumulation information 19c.

Figure 11:
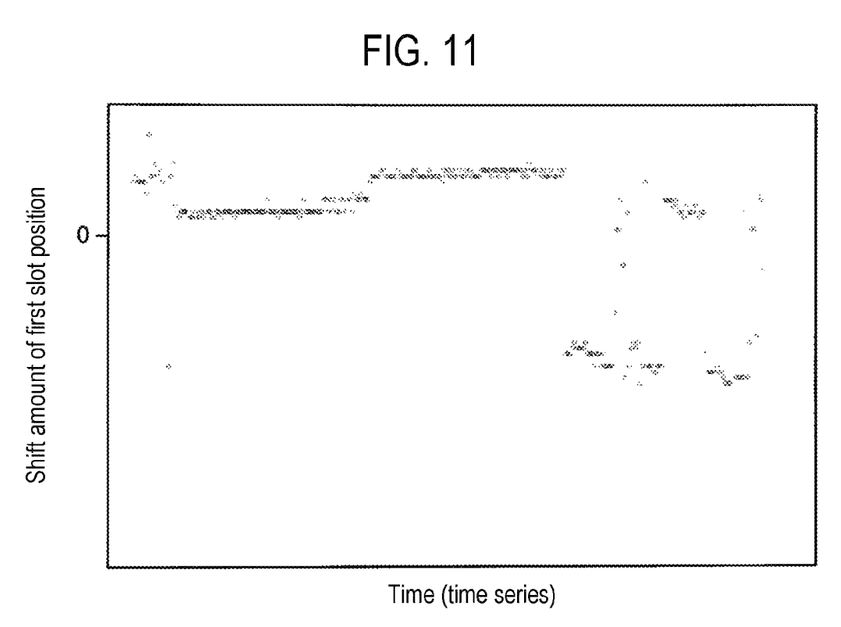
FIG. 11 is a view illustrating an example of a temporal change in a shift amount of a first slot position in a certain carrier.

FIG. 11 is a view illustrating an example of a temporal change of the shift amount of the first slot position in a certain carrier C. As shown in FIG. 11, the slot position of carrier C tends to decrease as it is repeatedly used. One of the causes is, for example, that the bottom surface of the resin-made carrier C is shaved as the resin-made carrier C is repeatedly mounted on the metal pins installed on the upper surfaces of the load ports P1 to P4.

The deterioration prediction part 18f calculates a median value of the shift amount of the first slot position from the carrier substrate position accumulation information 19c, and determines whether the calculated median value is less than a threshold value. Then, when the median value of the shift amount is less than the threshold value, the deterioration prediction part 18f determines that the carrier C is deteriorated. The threshold value used here is, for example, a value falling within a threshold value range (the range of the reference accommodation position ± a, described above) used for the abnormality determination for the first slot position by the abnormality determination part 18c. That is, the deterioration prediction part 18f predicts the deterioration of the carrier C before the first slot position is determined to abnormal by the abnormality determination part 18c.

The deterioration prediction part 18f calculates a median value of the shift amount of the first slot position, for example, each time when a mapping process is performed on a target carrier C, i.e., each time when the first slot position is accumulated in the carrier substrate position accumulation information 19c.

The notification part 18g notifies the deterioration of the carrier C before the carrier C predicted to be deteriorated by the deterioration prediction part 18f is mounted on each of the load ports P1 to P4 again. For example, the notification part 18g may turn on an indicator light (not shown) included in the substrate processing system 1 or may output deterioration prediction information including the carrier ID of the corresponding carrier C to a higher-level device. The notification part 18g may display the deterioration prediction information on a display part (not shown) included in the substrate processing system 1.

The notification by the notification part 18g may be performed before the corresponding carrier C is mounted on each of the load ports P1 to P4 again. For example, the notification may be performed when the deterioration prediction part 18f predicts the deterioration of the carrier C. After the processed wafer W is accommodated in the deterioration-predicted carrier C and the carrier C is unloaded from each of the load ports P1 to P4, i.e., after a series of substrate processing processes are completed, the notification part 18g may notify the deterioration of the carrier C.

By predicting and notifying the deterioration of the carrier C in this manner, it is possible to prevent using the carrier C having a high probability of being determined to be abnormal. Therefore, for example, it is possible to suppress a decrease in throughput due to the determination of the abnormality and the interruption of the process.

Although there has been described the example in which the deterioration prediction part 18f calculates the median value of the shift amount from the carrier substrate position accumulation information 19c, the deterioration prediction part 18f may calculate an average value of the shift amount. Furthermore, the deterioration prediction unit 18f may use a regression analysis technique to calculate, for example, a value of y when a regression line where a difference between two variables x and y is minimum is infinitely parallel to the x-axis.

Furthermore, although there has been described the example in which the deterioration of the carrier C is predicted based on the temporal change in the first slot position, the deterioration of the carrier C may be predicted based on, for example, a temporal change in the distance between the respective slots.

Other Embodiments

Since the heights of the load ports P1 to P4 are determined by the standard, the heights of the load ports P1 to P4 included in the substrate processing system 1 are adjusted to the same value. Therefore, the control part 18 may calculate an average value ((X1+X2+X3+X4)/4) of the respective reference accommodation positions of the load ports P1 to P4, and may determine that the load ports P1 to P4 having the reference accommodation position whose difference from the calculated average value exceeds a threshold value is poorly adjusted. Furthermore, the control part 18 may output poor adjustment information including the port IDs of the load ports P1 to P4 determined to be poorly adjusted to a higher-level device, or may cause a display part (not shown) of the substrate processing system 1 to display the poor adjustment information.

As described above, the substrate processing apparatus (for example, the processing unit 16) according to the embodiment includes a mounting part (for example, the load ports P1 to P4), a transfer part (for example, the first transfer device 13), a detection part (for example, the substrate detection part 7), and a correction part (for example, the correction part 18*e*). A carrier (for example, the carrier C) having a plurality of slots (for example, the slots S) capable of accommodating a plurality of substrates (for example, the wafers W) is mounted on the mounting part. The transfer part loads and unloads the substrates to and from the slots based on the reference accommodation position set in the mounting part. The detection part detects the positions of the substrates accommodated in the slots. The correction part corrects the reference accommodation position based on the port accumulation information (for example, the port accumulation information 19*a*) in which the detection results obtained by the detection part from the plurality of carriers mounted on the mounting part in the past are accumulated.

By correcting the reference accommodation position, for example, the threshold range centered on the reference accommodation position is optimized. Therefore, the frequency of abnormality determination in the mapping process is reduced. Thus, the frequency at which the mapping process is performed again after the retry process is reduced. Accordingly, it is possible to improve the efficiency of the mapping process.

The correction part may calculate, based on the port accumulation information, a predicted value of the position of the substrate predicted to be detected by the detection part when the carrier is mounted on the mounting part (for example, a median value of the shift amount between the first slot position and the reference accommodation position), and may correct the reference accommodation position based on the predicted value. As the detection results of the substrate position obtained by the detection part are accumulated in the port accumulation information, the accuracy of the predicted value of the substrate position is improved, and the correction of the reference accommodation position can be accurately performed based on the predicted value. Furthermore, it is also possible to designate the number in which a fixed number of port accumulation information is accumulated after correcting the reference accommodation position.

The correction part may correct the reference accommodation position using a value obtained by adding a predetermined correction value to the calculated predicted value. The substrate accommodated in the carrier tends to be inclined downward. Therefore, by adding the predetermined correction value to the predicted value, it is possible to more appropriately correct the reference accommodation position.

The substrate processing system according to the embodiment may further include a lid opening/closing mechanism (for example, the lid opening/closing mechanism 5), an abnormality determination part (for example, the abnormality determination part 18*c*), and an opening/closing control part (for example, the opening/closing control part 18*a*). The lid opening/closing mechanism opens and closes a lid (for example, the lid C1) of the carrier mounted on the mounting part. The abnormality determination unit determines the abnormality of the carrier based on a comparison of the position of the substrate detected by the detection part with the reference accommodation position. For each carrier C, based on the carrier abnormality accumulation information (for example, the carrier abnormality accumulation information 19*b*), the opening/closing control part controls the lid opening/closing mechanism to perform an operation of opening and closing the lid (for example, the pre-retry process) after the carrier is mounted on each of the mounting part and before the detection process is performed by the detection part.

Thus, it is possible to reduce the frequency of performing the mapping process again after the retry process, whereby the mapping process can be made more efficient. In addition, unlike the ordinary retry process, the pre-retry process opens and closes the lid without raising and lowering the lid. Therefore, the pre-retry process can be completed in a shorter time than the ordinary retry process.

The substrate processing system according to the embodiment may further include a deterioration prediction part (for example, the deterioration prediction part 180 and a notification part (for example, the notification part 18*g*). The deterioration prediction part predicts, for each carrier, the deterioration of the carrier based on the carrier substrate position accumulation information (for example, the carrier substrate position accumulation information 19*c*) in which the detection results obtained by the detection part is accumulated. The notification part notifies the deterioration of the carrier before the carrier predicted to be deteriorated by the deterioration prediction part is mounted on the mounting part again.

By predicting and notifying the deterioration of the carrier in this manner, it is possible to prevent using the carrier having a high probability of being determined to be abnormal in advance. Therefore, it is possible to suppress a decrease in throughput, for example, due to the determination of the abnormality and the interruption of the process. In addition, by preventing using the carrier having a high probability of being determined to be abnormal in advance, the frequency of abnormality determination for the carrier is reduced, and the frequency at which the mapping process is performed again after the retry process is reduced. Accordingly, it is possible to improve the efficiency of the mapping process.

The deterioration prediction part may calculate, based on the carrier substrate position accumulation information, a predicted value of the position of the substrate predicted to be detected by the detection part when the carrier is mounted on the mounting part, and may predict the deterioration of the carrier when the predicted value is less than a deterioration determination threshold value. As the detection results of the substrate position obtained by the detection part are accumulated in the carrier substrate position accumulation information, the accuracy of the predicted value of the substrate position is improved. Therefore, it is possible to more accurately predict the deterioration of the carrier.

According to the present disclosure in some embodiments, it is possible to enhance the efficiency of a mapping process.

While certain embodiments have been described, these embodiments have been presented by way of example only, and are not intended to limit the scope of the disclosures.

Indeed, the embodiments described herein may be embodied in a variety of other forms. Furthermore, various omissions, substitutions, and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A substrate processing apparatus, comprising:
a mounting part on which a carrier having a plurality of slots capable of accommodating a plurality of substrates is mounted;
a transfer part configured to load and unload the substrates to and from the plurality of slots based on a reference accommodation position set in the mounting part;
a detection part configured to detect a height position of a substrate of the plurality of substrates accommodated in the plurality of slots;
a correction part configured to correct the reference accommodation position based on port accumulation information in which height positions of substrates previously detected by the detection part from a plurality of carriers which has been mounted on the mounting part in the past are accumulated, by incorporating a discrepancy between the reference accommodation position before correction and the height positions of the port accumulation information into the reference accommodation position for the correction;
a deterioration prediction part configured to, for each carrier, predict deterioration of the carrier based on carrier substrate position accumulation information in which the height positions of the substrates previously detected by the detection part are accumulated; and
a notification part configured to notify deterioration of the carrier before the carrier predicted to be deteriorated by the deterioration prediction part is mounted on the mounting part again.

2. The apparatus of claim 1, wherein the correction part calculates, based on the port accumulation information, a predicted value of a height position of a substrate predicted to be detected by the detection part when the carrier is mounted on the mounting part, and corrects the reference accommodation position based on the predicted value.

3. The apparatus of claim 2, wherein the correction part corrects the reference accommodation position using a value obtained by adding a predetermined correction value to the predicted value.

4. The apparatus of claim 3, further comprising:
a lid opening/closing mechanism configured to open and close a lid of the carrier mounted on the mounting part;
an abnormality determination part configured to determine an abnormality of the carrier based on a comparison of the height position of the substrate of the plurality of substrates detected by the detection part with the reference accommodation position; and
an opening/closing control part configured to, for each carrier, based on carrier abnormality accumulation information in which determination results obtained by the abnormality determination part are accumulated, control the lid opening/closing mechanism to perform an operation of opening and closing the lid, after the carrier is mounted on the mounting part and before a detection process is performed by the detection part.

5. The apparatus of claim 4, wherein the deterioration prediction part configured to, based on the carrier substrate position accumulation information, calculate another predicted value of the height position of the substrate predicted to be detected by the detection part when the carrier is mounted on the mounting part, and predict deterioration of the carrier when the another predicted value is less than a deterioration determination threshold value.

6. The apparatus of claim 1, further comprising:
a lid opening/closing mechanism configured to open and close a lid of the carrier mounted on the mounting part;
an abnormality determination part configured to determine an abnormality of the carrier based on a comparison of the height position of the substrate of the plurality of substrates detected by the detection part with the reference accommodation position; and
an opening/closing control part configured to, for each carrier, based on carrier abnormality accumulation information in which determination results obtained by the abnormality determination part are accumulated, control the lid opening/closing mechanism to perform an operation of opening and closing the lid, after the carrier is mounted on the mounting part and before a detection process is performed by the detection part.

7. A substrate processing method, comprising:
mounting, on a mounting part, a carrier having a plurality of slots capable of accommodating a plurality of substrates;
loading and unloading the substrates to and from the plurality of slots based on a reference accommodation position set in the mounting part;
detecting a height position of a substrate of the plurality of substrates accommodated in the plurality of slots using a detection part;
correcting the reference accommodation position based on port accumulation information in which height positions of substrates previously detected by the detection part from a plurality of carriers which has been mounted on the mounting part in the past are accumulated, by incorporating a discrepancy between the reference accommodation position before correction and the height positions of the port accumulation information into the reference accommodation position for the correction;
predicting, for each carrier, by a deterioration prediction part, deterioration of the carrier based on carrier substrate position accumulation information in which the height positions of the substrates previously detected in the detection step are accumulated; and
notifying, by a notification part, deterioration of the carrier before the carrier predicted to be deteriorated by the deterioration prediction part is mounted on the mounting part again.

* * * * *